United States Patent [19]
Frerking

[11] Patent Number: 4,891,611
[45] Date of Patent: Jan. 2, 1990

[54] VIBRATION COMPENSATED CRYSTAL OSCILLATOR

[75] Inventor: Marvin E. Frerking, Cedar Rapids, Iowa

[73] Assignee: Rockwell International Corporation, El Segundo, Calif.

[21] Appl. No.: 321,490

[22] Filed: Mar. 9, 1989

[51] Int. Cl.⁴ .......................... H03B 5/04; H03B 5/32
[52] U.S. Cl. ..................................... 331/158; 331/10; 331/175
[58] Field of Search ............. 331/65, 116 R, 116 FE, 331/158, 175

[56] References Cited
U.S. PATENT DOCUMENTS

| | | | |
|---|---|---|---|
| 4,096,445 | 6/1978 | Hopwood et al. | 331/17 |
| 4,100,512 | 7/1978 | Valdois et al. | 331/158 |
| 4,277,758 | 7/1981 | Mishiro | 331/1 R |
| 4,318,063 | 3/1982 | Przyjemski | 331/158 |
| 4,453,141 | 6/1984 | Rosati | 331/158 |
| 4,458,536 | 7/1984 | Ahn et al. | 73/652 |
| 4,575,690 | 3/1986 | Walls et al. | 331/162 |
| 4,609,885 | 9/1986 | Renoult | 331/158 |

Primary Examiner—Siegfried H. Grimm
Attorney, Agent, or Firm—John C. McFarren; M. Lee Murrah; H. Fredrick Hamann

[57] ABSTRACT

In order to compensate for mechanical vibration that corrupts the RF output spectrum of a crystal oscillator, three accelerometers are mounted with the oscillator and aligned on mutually perpendicular axes. The outputs of the accelerometers are digitized and applied to adaptive transversal filters comprising a digital signal processor. The crystal oscillator is placed on a vibration table and its output is compared with an external frequency reference. The tap weights of the filters are then optimized so that the vibration components of the output spectrum of the oscillator are minimized. After the tap weights of the filters are determined and fixed, the filters provide vibration compensation for the oscillator. During operation of the crystal oscillator, the outputs of the filters are summed and applied to a varactor in the oscillator to compensate the output for the effects of mechanical vibration.

19 Claims, 3 Drawing Sheets

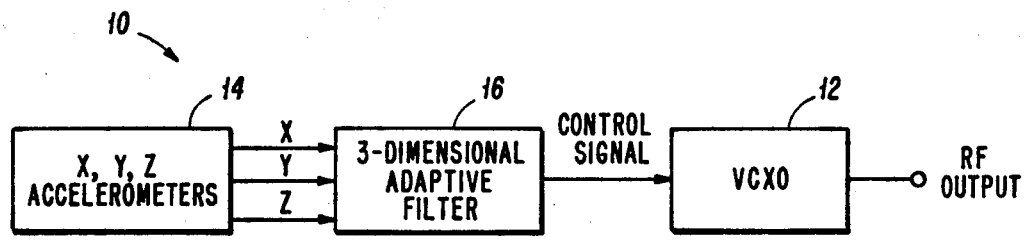
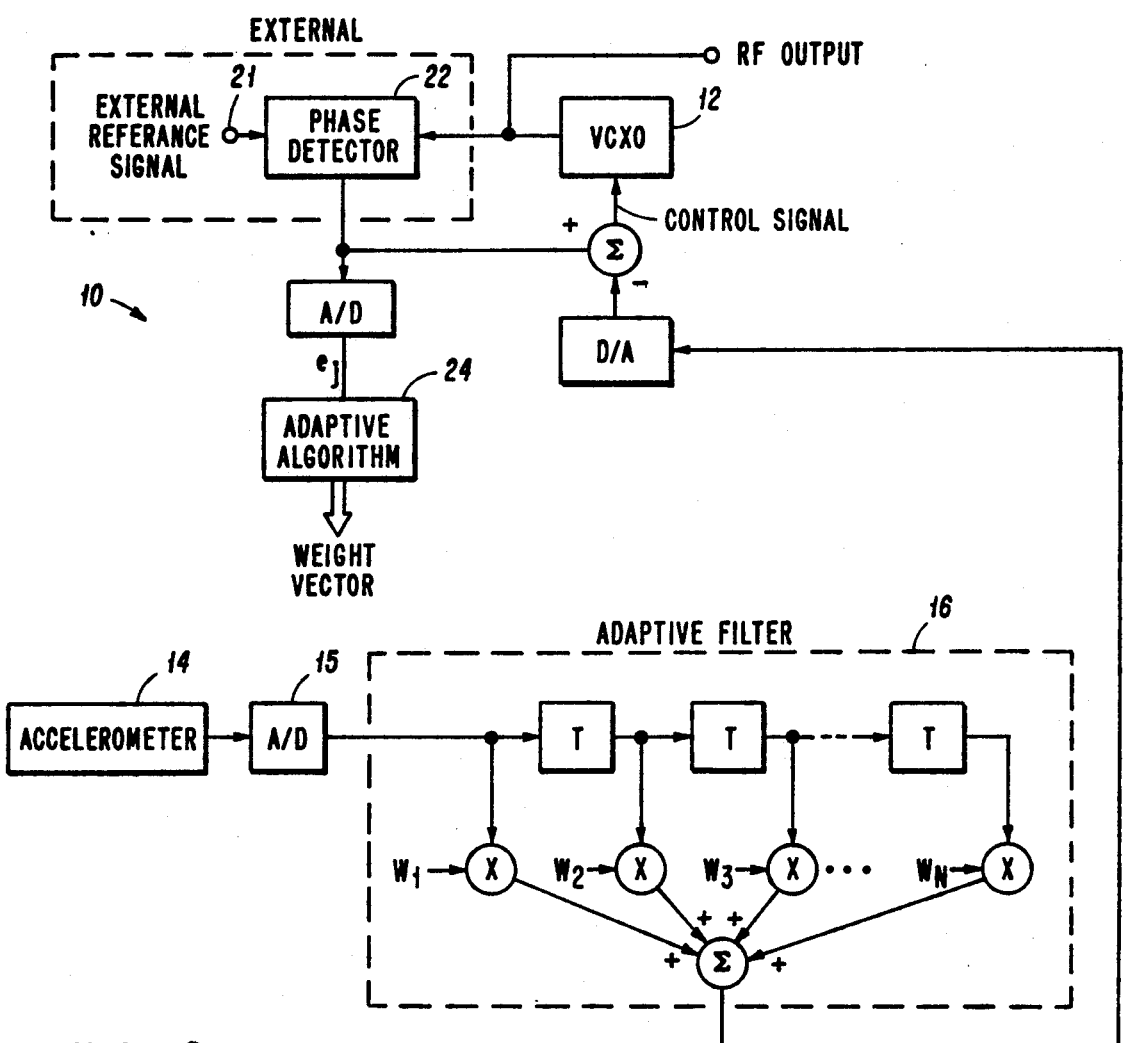
FIG 1
FIG 2

//ocr_cache/de26cb20-5005-451b-97d9-1cff00df2b17.md
VIBRATION COMPENSATED CRYSTAL OSCILLATOR

TECHNICAL FIELD

The present invention relates to electrical oscillator circuits and, in particular, to a voltage controlled crystal oscillator circuit that includes accelerometers and a digital signal processor to compensate for phase noise caused by mechanical vibration.

BACKGROUND OF THE INVENTION

The use of crystals, such as quartz crystals, is well known for the purpose of controlling the frequency of electrical oscillator circuits. However, it is also well known that the natural resonant frequency of such crystals changes when the crystals are subjected to forces that cause acceleration. Thus, for crystal oscillators operating in environments subject to acceleration and vibration, such as in aircraft, it is desirable to have some method for reducing oscillator frequency shifts and phase noise caused by acceleration.

The known methods for reducing the acceleration sensitivity of crystal oscillators include both active and passive methods. Passive methods make no attempt to sense mechanical vibration or to dynamically change the output frequency of the crystal oscillator. Such methods typically use vibration isolators having pairs of crystals aligned in anti-parallel relationship to cancel the acceleration induced frequency shifts. In active methods, acceleration sensors and feedback networks are used to compensate for the acceleration induced frequency shifts by adjusting the oscillator frequency.

Although active and passive methods have been used for vibration compensation, currently available vibration compensation schemes have not been entirely satisfactory over a broad range of vibration frequencies. Thus, there is a need for a vibration compensation scheme for crystal oscillators that compensates for acceleration induced phase noise and frequency shifts in crystal oscillators over a wide range of vibration frequencies.

SUMMARY OF THE INVENTION

The present invention comprises a voltage controlled crystal oscillator circuit that includes accelerometers and a digital signal processor that compensates the oscillator RF output for the effects of mechanical vibration. In a preferred embodiment of the present invention, three accelerometers are mounted with the crystal oscillator and aligned on mutually perpendicular axes. The outputs of the accelerometers are digitized and applied to a three-dimensional adaptive transversal filter of the digital signal processor. The weighted outputs of the filter are summed and applied to a varactor in the crystal oscillator so that the RF output is compensated for the effects of mechanical vibration.

During construction of the vibration compensated crystal oscillator, the oscillator and accelerometers are placed on a vibration table. The oscillator output and an external frequency reference are input to an external phase detector while the table typically provides random vibration. The digital filters are adjusted so that the oscillator noise components induced by the vibration are minimized. The optimum filter tap weights are determined and then fixed for the operational life of the oscillator. During operation of the oscillator, the three-dimensional filter of the digital signal processor varies the gain and phase of the accelerometer signals precisely as a function of frequency. Therefore, as long as the mechanical configuration of the oscillator remains stable in the field, vibration compensation is maintained for the oscillator through the various mechanical resonances.

BRIEF DESCRIPTION OF THE DRAWINGS

For a more complete understanding of the present invention and for further advantages thereof, reference is made to the following Description of the Preferred Embodiments taken in conjunction with the accompanying Drawings. Throughout the several FIGURES, the same reference numerals indicate the same or similar components of the present invention, in which:

FIG. 1 is a block diagram of a basic vibration compensated crystal oscillator of the present invention;

FIG. 2 is a block diagram illustrating the function of one dimension of an adaptive filter of the present invention;

DETAILED DESCRIPTION OF THE PREFERRED EMBODIMENTS

Figure 3:
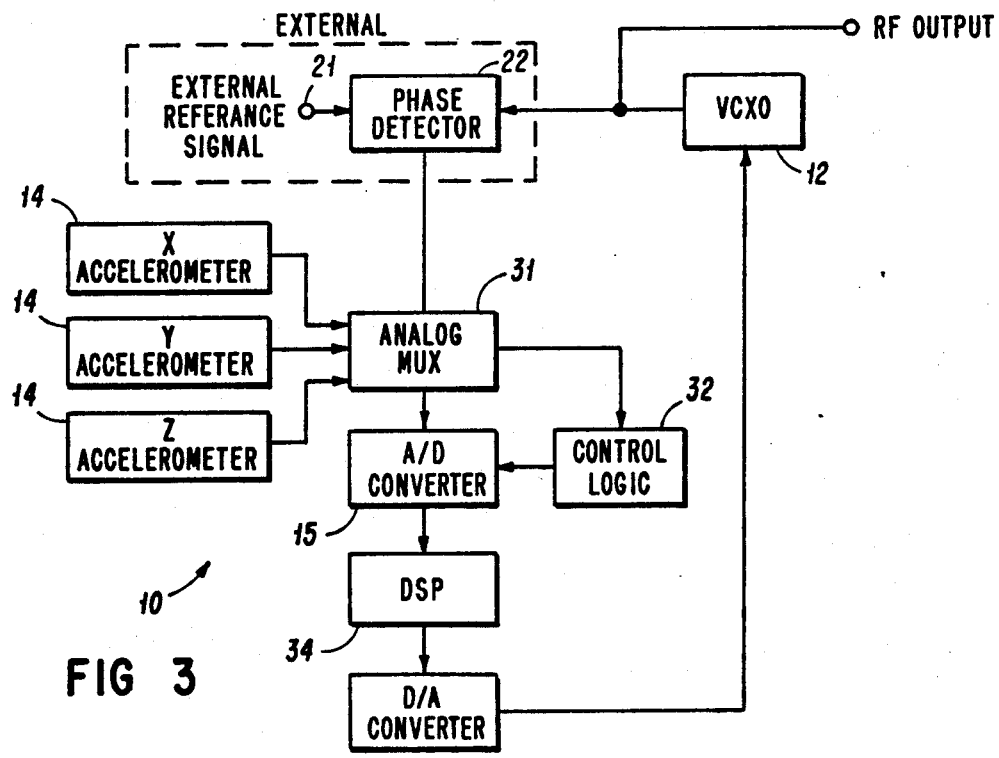
FIG. 3 is a block diagram illustrating a hardware implementation of the present invention.

Referring to FIG. 1, a vibration compensated crystal oscillator 10 of the present invention is illustrated in simplified block diagram form. Oscillator 10 comprises a voltage controlled crystal oscillator (VCXO) 12 that provides an RF output. Mounted with VCXO 12 are accelerometers 14 aligned to sense mechanical vibrations along the X, Y, and Z axes. Alternatively, a single accelerometer may be used with its axis aligned with the acceleration axis of the crystal. The outputs of accelerometers 14 are digitized and applied to an adaptive transversal filter 16. Filter 16 may comprise separate filters for each of the X, Y, and Z accelerometers. Alternatively, filter 16 may comprise a three-dimensional adaptive digital filter implemented using a single digital signal processor (DSP) such as the TMS320C25. Filter 16 generates a control signal that is applied to VCXO 12 to compensate for any vibration induced noise, thereby stabilizing the RF output of VCXO 12. Tap weights of filter 16 can be optimized during manufacture of oscillator 10 and then fixed for the operational life of oscillator 10. Filter 16 functions to vary the gain and phase of the output signals of accelerometers 14 very precisely as a function of frequency. As long as the mechanical configuration of oscillator 10 remains stable in the field, the fixed tap weights of filter 16 provide vibration compensation for the RF output through the various mechanical resonances.

FIG. 2 illustrates the determination of tap weights $w_1 \ldots w_N$ for adaptive filter 16 for one dimension of accelerometer 14. The output of accelerometer 14 is digitized by analog-to-digital converter 15 for input to adaptive filter 16. To optimize the tap weights of filter 16, oscillator 10 is placed on a vibration table and the output of VCXO 12 is compared with a stable external reference 21 by a phase difference detector 22. Any output from phase detector 22 is a result of vibration induced sidebands from VCXO 12. The tap weight outputs of filter 16 are summed and applied to a varactor in VCXO 12 so that the output of VCXO 12 is compensated for the effects of the vibration. If the summed compensation voltage from adaptive filter 16 is perfect, the vibration induced sidebands are cancelled and the phase detector output is a DC signal. In this manner, the tap weights $w_1 \ldots w_N$ of adaptive transversal filter 16 are adjusted to minimize the error voltage $e_j$ resulting from the vibration table. The optimum tap weights may be determined by using an adaptive filter algorithm, such as a least mean square gradient search, to correlate the total error signal individually against the output of each delay element and integrating over a period of time.

FIG. 3 illustrates a hardware implementation of oscillator 10. The outputs of the X, Y, and Z accelerometers 14 are provided to an analog multiplexer 31. Control logic 32 may comprise a programmable array logic (PAL). A separate crystal may be used as the clock for digital signal processor (DSP) 34, or a multiplier may be used with VCXO 12 to provide the clock for DSP 34. DSP 34 may require an external RAM to provide sufficient storage for the adaptive transversal filters 16 comprising DSP 34.

Figure 4:
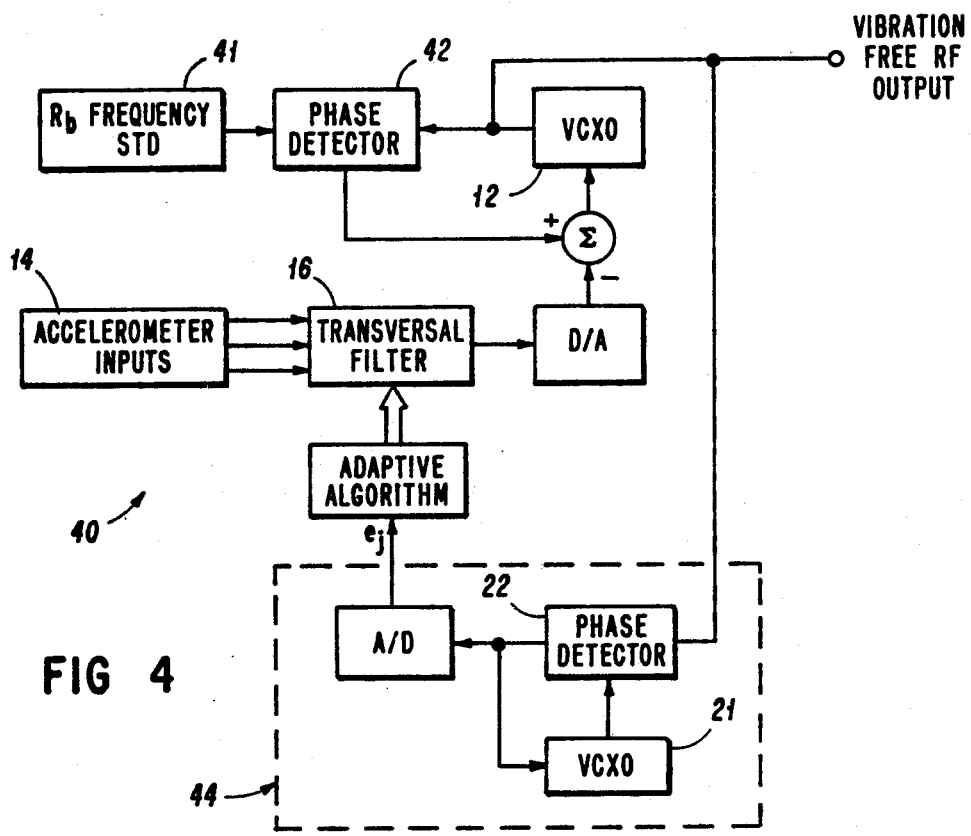
FIG. 4 is a block diagram of an embodiment of the present invention in which the crystal oscillator frequency is locked to an atomic frequency standard.

Another embodiment of the present invention is illustrated in FIG. 4. Vibration compensated crystal oscillator 40 includes VCXO 12 that is locked to an atomic frequency standard ($R_b$) 41. In oscillator 40, transversal filter 16 compensates for both the VCXO 12 sidebands and for the control line variations caused by phase modulation of the atomic frequency standard 41. To adapt the tap weights of filter 16 of oscillator 40, the external frequency reference 21 is provided by a second VCXO. Phase detector 22 compares the output of VCXO 12 (which is on a vibration table) with the output of external VCXO 21. After the tap weights of filter 16 are determined and fixed, the external circuitry 44 is no longer required for operation of oscillator 40.

Figure 5:
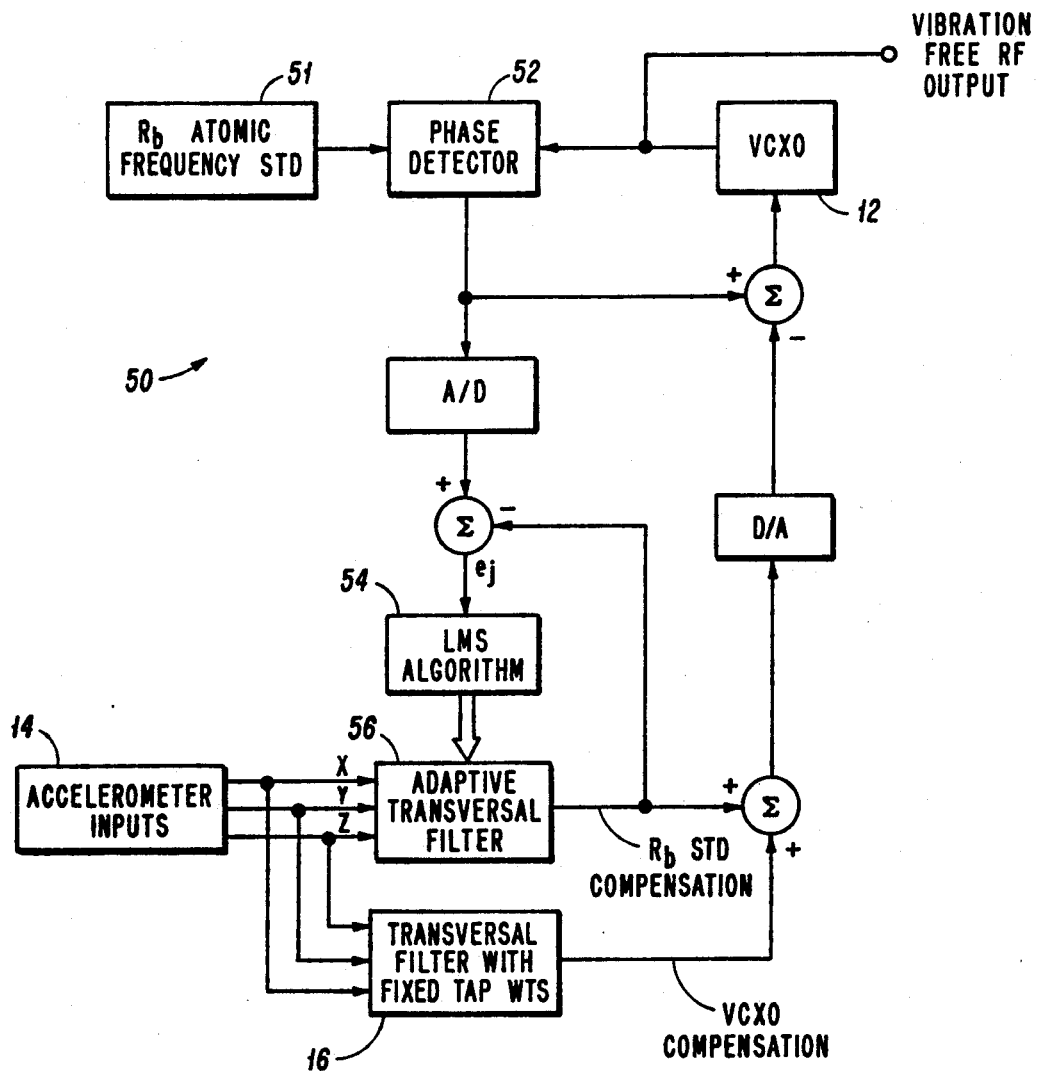
FIG. 5 is a block diagram of a continuously adaptable vibration compensated crystal oscillator of the present invention.

A further embodiment of the present invention is illustrated in FIG. 5. Vibration compensated crystal oscillator 50 includes an atomic frequency standard 51 that is not characterized during the manufacturing process of oscillator 50. In oscillator 50, transversal filter 16 is calibrated during manufacture in the method described above. A second adaptive transversal filter 56 is added to generate a compensation voltage to cancel the effect of the vibration sidebands on the atomic frequency standard 51. Thus, the output spectrum of VCXO 12 is uncorrupted by the sideband structure of atomic standard 51. An LMS adaptive algorithm 54 may be used to determine the tap weight vector for filter 56. During operation of oscillator 50, the tap weights of adaptive filter 56 cannot be optimized until a vibration is actually encountered, thus causing a delay in fully compensating the output of VCXO 12.

Although the present invention has been described with respect to specific embodiments thereof, various changes and modifications may be suggested to one skilled in the art, and it is intended that the present invention encompass such changes and modifications as fall within the scope of the appended claims.

I claim:

1. An electrical oscillator circuit, comprising:
   a voltage controlled crystal oscillator (VCXO) providing an RF output;
   means for sensing mechanical vibration of said VCXO that induces noise in said RF output and for generating an acceleration signal;
   means for digitizing said acceleration signal;
   means for filtering said digitized signals to provide a control signal to said VCXO; and
   said control signal stablizing said RF output by compensating for said vibration induced noise.

2. The oscillator circuit of claim 1, wherein said means for sensing mechanical vibration comprises an accelerometer mounted with said VCXO.

3. The oscillator circuit of claim 1, wherein said means for sensing mechanical vibration comprises three accelerometers mounted with said VCXO and aligned on mutually perpendicular axes for generating three acceleration signals.

4. The oscillator circuit of claim 3, wherein said digitizing means comprises an analog multiplexer for receiving said acceleration signals and an analog-to-digital converter connected to said multiplexer.

5. The oscillator circuit of claim 3, wherein said filtering means comprises three adaptive transversal filters forming a digital signal processor.

6. The oscillator circuit of claim 3, wherein said filtering means comprises a three-dimensional adaptive transversal filter.

7. The oscillator circuit of claim 6, wherein said adaptive transversal filter comprises adjustable tap weights.

8. The oscillator circuit of claim 7, wherein said adjustable tap weights are adjusted and fixed during manufacture of said oscillator circuit.

9. A vibration compensated crystal oscillator circuit, comprising:
   a voltage controlled crystal oscillator (VCXO) providing an RF output;
   an accelerometer mounted with said VCXO for sensing mechanical vibrations and for providing an acceleration signal corresponding to said vibrations;
   means connected to said accelerometer for digitizing said acceleration signal;
   a digital signal processor for varying gain and phase of said digitized acceleration signal as a function of frequency; and
   said digital signal processor providing a control signal to said VCXO to compensate said VCXO for said mechanical vibrations thereby stabilizing said RF output.

10. The oscillator circuit of claim 9, wherein said accelerometer comprises three accelerometer units mounted on mutually perpendicular axes.

11. The oscillator circuit of claim 10, wherein said digitizing means comprises an analog multiplexer connected to said accelerometer units and an analog-to-digital converter connected to said multiplexer.

12. The oscillator circuit of claim 10, wherein said digital signal processor comprises three adaptive transversal filters connected to receive said digitized signals of said accelerometer units.

13. The oscillator circuit of claim 10, wherein said digital signal processor comprises a three-dimensional adaptive transversal filter.

14. The oscillator circuit of claim 13, wherein said filter comprises adjustable tap weights.

15. The oscillator circuit of claim 14, wherein said tap weights are adjusted and fixed during manufacture of said oscillator circuit.

16. A vibration compensated crystal oscillator circuit, comprising:

a voltage controlled crystal oscillator (VCXO) providing an RF output;

three accelerometers mounted with said VCXO and aligned along mutually perpendicular axes, said accelerometers sensing mechanical vibrations and providing acceleration signals corresponding to said vibrations;

an analog multiplexer connected to receive said acceleration signals;

an analog-to-digital converter connected to said multiplexer for digitizing said acceleration signals;

a digital signal processor for varying gain and phase of said digitized signals as a function of frequency; and said digital signal processor providing a control signal to stabilize said RF output by compensating said VCXO for said mechanical vibrations.

17. The oscillator circuit of claim 16, wherein said digital signal processor comprises a three-dimensional adaptive transversal filter.

18. The oscillator circuit of claim 17, wherein said filter comprises adjustable tap weights.

19. The oscillator circuit of claim 18, wherein said adjustable tap weights are adjusted and fixed during manufacture of said oscillator circuit to provide vibration compensation during operation of said oscillator circuit.

* * * * *